(12) United States Patent
Nomura

(10) Patent No.: US 9,679,910 B2
(45) Date of Patent: Jun. 13, 2017

(54) SEMICONDUCTOR DEVICE AND METHOD FOR MANUFACTURING SAME

(71) Applicant: Kabushiki Kaisha Toshiba, Minato-ku (JP)

(72) Inventor: Kotaro Nomura, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/923,916

(22) Filed: Oct. 27, 2015

(65) Prior Publication Data

US 2017/0062455 A1     Mar. 2, 2017

Related U.S. Application Data

(60) Provisional application No. 62/211,220, filed on Aug. 28, 2015.

(51) Int. Cl.
*H01L 29/792*     (2006.01)
*H01L 27/11582*   (2017.01)

(52) U.S. Cl.
CPC .............. *H01L 27/11582* (2013.01)

(58) Field of Classification Search
CPC ............ H01L 27/11556; H01L 27/11582
USPC ................................. 257/317, 324
See application file for complete search history.

(56) References Cited

U.S. PATENT DOCUMENTS

| | | | |
|---|---|---|---|
| 8,405,141 B2* | 3/2013 | Matsuda | H01L 27/11573 257/324 |
| 8,409,977 B2 | 4/2013 | Shim et al. | |
| 8,410,003 B2 | 4/2013 | Ota et al. | |
| 8,541,831 B2* | 9/2013 | Chae | H01L 27/11578 257/315 |
| 2011/0057249 A1 | 3/2011 | Nakao et al. | |
| 2011/0204420 A1* | 8/2011 | Kim | H01L 27/0688 257/211 |

* cited by examiner

*Primary Examiner* — Hung Vu
(74) *Attorney, Agent, or Firm* — Oblon, McClelland, Maier & Neustadt, L.L.P.

(57) ABSTRACT

According to one embodiment, a semiconductor memory device includes: a substrate; a first stacked body; a semiconductor film; a charge storage film; and a second stacked body. The first stacked body includes: a plurality of first insulating layers; and a plurality of electrode layers. The second stacked body includes: a plurality of second insulating layers; a first insulating film provided between the plurality of second insulating layers and including a material different from that of the plurality of first insulating layers, the plurality of second insulating layers, and the plurality of electrode layers; and a second insulating film provided between the first insulating film and the substrate via the plurality of second insulating layers, including a same material as the first insulating film, and having lower film density than the first insulating film.

15 Claims, 14 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from U.S. Provisional Patent Application 62/211,220 field on Aug. 28, 2015; the entire contents of which are incorporated herein by reference.

FIELD

Embodiments described herein relate generally to a semiconductor device and a method for manufacturing same.

BACKGROUND

A device of the three-dimensional structure has been proposed. The device includes a stacked body of a plurality of electrode layers separately stacked each other. A hole is formed in the stacked body. A silicon body constituting a channel is provided on the sidewall of the hole via a charge storage film.

There is concern about the degradation of characteristics in the aforementioned device.

DETAILED DESCRIPTION

Figure 1:
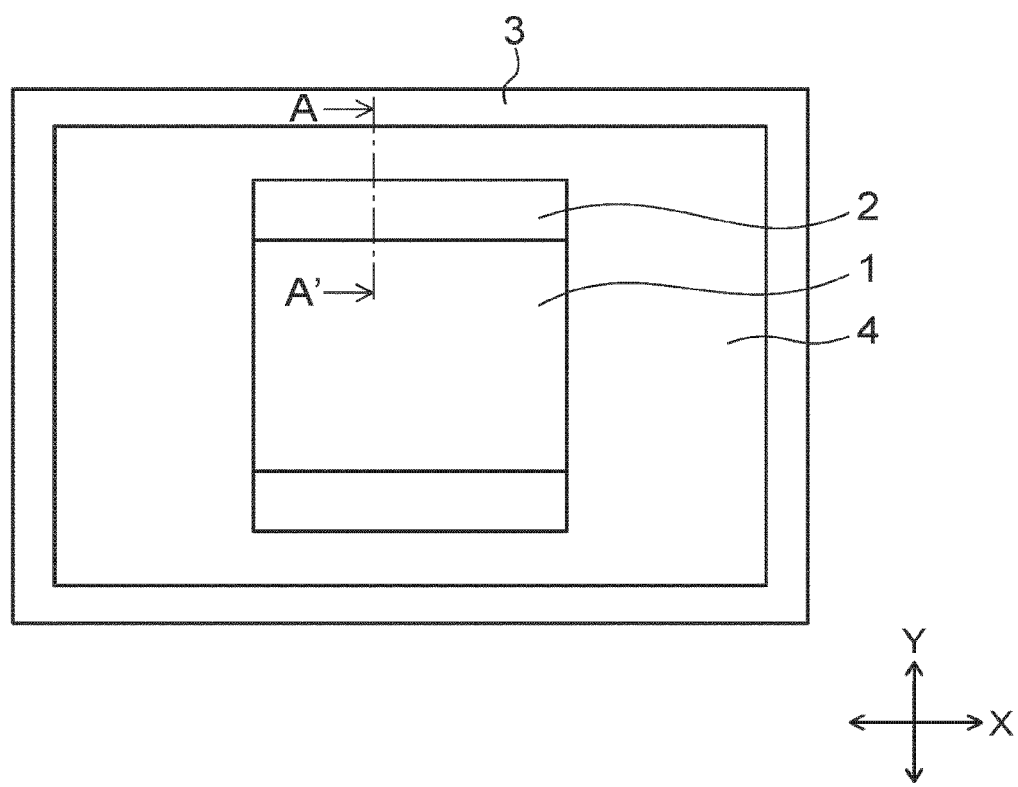
FIG. 1 is a schematic plan view of the semiconductor device of an embodiment.

According to one embodiment, a semiconductor memory device includes: a substrate; a first stacked body provided on the substrate; a semiconductor film provided in the first stacked body and extending in stacking direction of the first stacked body; a charge storage film provided between the plurality of electrode layers and the semiconductor film; and a second stacked body provided on the substrate. The first stacked body includes: a plurality of first insulating layers separately stacked each other; and a plurality of electrode layers provided between the plurality of first insulating layers. The second stacked body includes: a plurality of second insulating layers separately stacked each other and including a same material as the plurality of first insulating layers; a first insulating film provided between the plurality of second insulating layers and including a material different from that of the plurality of first insulating layers, the plurality of second insulating layers, and the plurality of electrode layers; and a second insulating film provided between the first insulating film and the substrate via the plurality of second insulating layers, including a same material as the first insulating film, and having lower film density than the first insulating film.

The embodiment will now be described with reference to the drawings. In the drawings, like elements are labeled with like reference numerals.

An example of the configuration of a semiconductor device of the embodiment is described with reference to FIGS. 1 and 2.

FIG. 1 is a schematic plan view showing the configuration of the semiconductor device of the embodiment.

Figure 2:
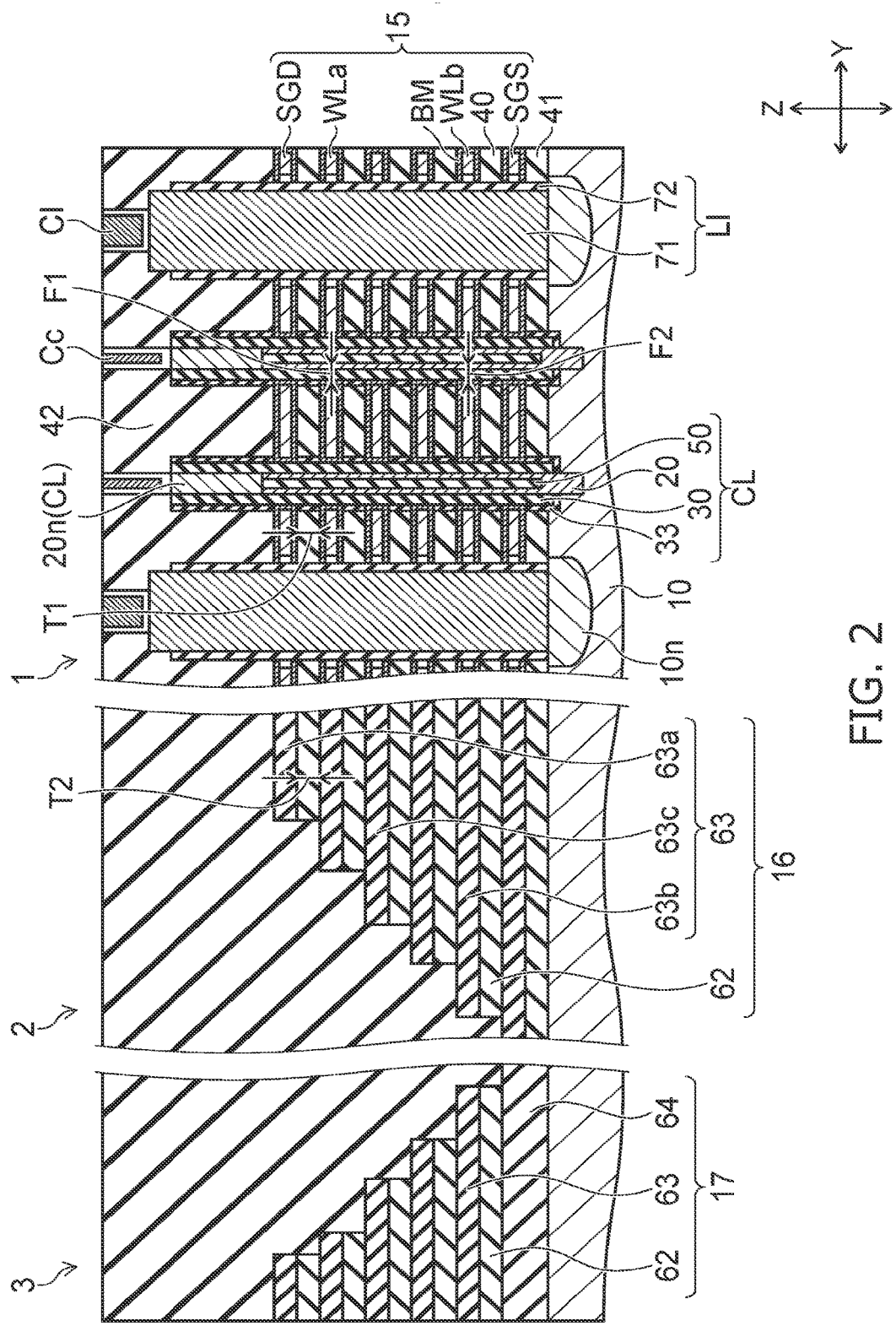
FIG. 2 is a schematic sectional view of the semiconductor device of the embodiment.

FIG. 2 is a schematic sectional view corresponding to A-A' of FIG. 1.

In FIGS. 1 and 2, two directions orthogonal to each other are referred to as X-direction (first direction) and Y-direction (second direction). The direction orthogonal to the X-direction and the Y-direction (X-Y plane) is referred to as Z-direction (stacking direction). A plurality of electrode layers WL is stacked in the Z-direction.

As shown in FIG. 1, the semiconductor device of the embodiment includes a memory cell section 1, a staircase section 2 (dummy staircase section), a scribe line 3, and a peripheral circuit 4. The memory cell section 1, the staircase section 2, and the peripheral circuit 4 are surrounded with the scribe line 3. The staircase section 2 is provided between the memory cell section 1 and the peripheral circuit 4. The peripheral circuit 4 includes a transistor. The transistor controls e.g. the memory cell array of the memory cell section 1.

As shown in FIG. 2, the memory cell section 1 includes a first stacked body 15 on a substrate 10. The first stacked body 15 includes a source side select gate SGS, a drain side select gate SGD, a plurality of electrode layers WL, and a plurality of insulating layers 40.

The source side select gate SGS is provided in the lowermost layer of the first stacked body 15. The drain side select gate SGD is provided in the uppermost layer of the first stacked body 15.

The plurality of first insulating layers 40 is separately stacked each other. The plurality of electrode layers WL is provided between the plurality of first insulating layers 40. The wall surface (upper surface, lower surface, and side surface) of the plurality of electrode layers WL is provided with a barrier film BM. The number of electrode layers WL shown in the figure is illustrative only. The number of electrode layers WL and first insulating layers 40 is arbitrary.

The thickness of the drain side select gate SGD and the thickness of the source side select gate SGS are thicker than e.g. the thickness of one electrode layer WL. The drain side select gate SGD and the source side select gate SGS may be provided in a plurality. The thickness of the drain side select gate SGD and the thickness of the source side select gate SGS may be equal to or thinner than the thickness of one electrode layer WL. In this case, the drain side select gate SGD and the source side select gate SGS may be provided in a plurality as described above. The term "thickness" used herein refers to the thickness in the stacking direction (Z-direction) of the first stacked body 15.

The electrode layer WL includes a metal. The electrode layer WL includes at least one of e.g. tungsten, molybdenum, titanium nitride, and tungsten nitride. The electrode layer WL may include silicon or metal silicide. The source side select gate SGS and the drain side select gate SGD include the same material as the electrode layer WL. The first insulating layer 40 includes e.g. silicon oxide film. The barrier film BM includes e.g. titanium. The barrier film BM includes a stacked film of titanium and titanium nitride. The details of the memory cell section 1 will be described later.

The staircase section 2 includes a second stacked body 16 on the substrate 10. The second stacked body 16 includes a plurality of second insulating layers 62 and a plurality of third insulating layers 63.

The plurality of second insulating layers 62 is separately stacked each other. The plurality of third insulating layers 63 is provided between the plurality of second insulating layers 62. The number of stacked layers of the plurality of second insulating layers 62 is equal to the number of stacked layers of the plurality of first insulating layers 40. The number of stacked layers of the plurality of third insulating layers 63 is equal to e.g. the total number of stacked layers of the number of stacked layers of the plurality of electrode layers WL, the number of stacked layers of the source side select gates SGS, and the number of stacked layers of the drain side select gates SGD. In this case, the number of stacked layers of the second stacked body 16 is equal to the number of stacked layers of the first stacked body 15.

The plurality of second insulating layers 62 includes the same material as the plurality of first insulating layers 40. The plurality of second insulating layers 62 includes e.g. silicon oxide film. In the Z-direction, the thickness T2 of the plurality of second insulating layers 62 is thicker than the thickness T1 of the plurality of first insulating layers 40. The plurality of second insulating layers 62 may be integrated with e.g. the plurality of first insulating layers 40.

The plurality of third insulating layers 63 includes a material different from that of the plurality of first insulating layers 40, the plurality of second insulating layers 62, and the plurality of electrode layers WL. The plurality of third insulating layers 63 includes e.g. silicon nitride film.

The plurality of third insulating layers 63 includes a first insulating film 63a, a second insulating film 63b, and a third insulating film 63c. The first insulating film 63a, the second insulating film 63b, and the third insulating film 63c include the same material, and include e.g. silicon nitride film.

The second insulating films 63b are provided via the plurality of second insulating layers 62 between the first insulating film 63a and the substrate 10. The third insulating films 63c are provided via the plurality of second insulating layers 62 between the first insulating film 63a and the second insulating film 63b. That is, the first insulating film 63a is provided above the third insulating film 63c. The third insulating film 63c is provided above the second insulating film 63b.

Here, the film density of the second insulating film 63b is lower than the film density of the first insulating film 63a and the film density of the third insulating film 63c. The film density of the third insulating film 63c is lower than the film density of the first insulating film 63a. That is, the plurality of third insulating layers 63 has higher film density with the distance in the Z-direction from the substrate 10. The film density is represented in e.g. weight per unit volume (g/cm³).

The second stacked body 16 has a staircase shape. The staircase shape is formed from the upper surface of the plurality of third insulating layers 63. Alternatively, the staircase shape may be formed from e.g. the upper surface of the plurality of second insulating layers 62.

The scribe line 3 includes a third stacked body 17 via an insulating layer 64 on the substrate 10. The height of the insulating layer 64 is equal to e.g. the height from the lower surface of the first stacked body 15 to the upper surface of the source side select gate SGS.

Like the second stacked body 16, the third stacked body 17 includes a plurality of second insulating layers 62 and a plurality of third insulating layers 63. The number of stacked layers of the plurality of second insulating layers 62 of the third stacked body 17 is smaller than the number of stacked layers of the plurality of first insulating layers 40. The number of stacked layers of the plurality of third insulating layers 63 of the third stacked body 17 is equal to e.g. the total number of stacked layers of the number of stacked layers of the plurality of electrode layers WL and the number of stacked layers of the drain side select gates SGD. In this case, the number of stacked layers of the third stacked body 17 is smaller than the number of stacked layers of the first stacked body 15.

In the Z-direction, the plurality of third insulating layers 63 of the third stacked body 17 has higher film density toward the top of the third stacked body 17. The third stacked body 17 has a staircase shape. The staircase shape of the third stacked body 17 and the staircase shape of the second stacked body 16 are provided symmetrically in e.g. the Y-direction.

An example of the configuration of the memory cell section 1 is described with reference to FIGS. 2 and 3.

Figure 3:
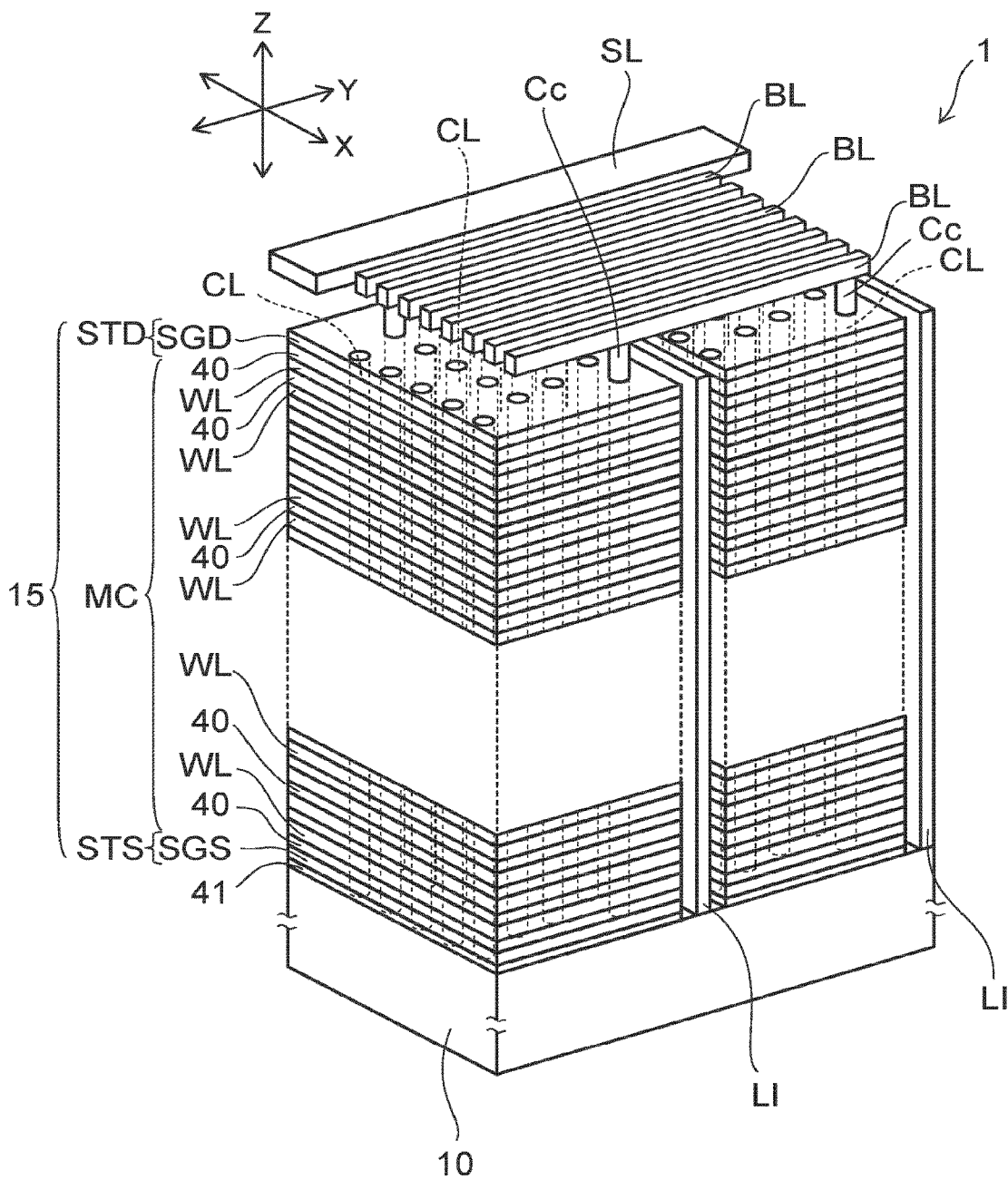
FIG. 3 is a schematic perspective view of the memory cell array of the embodiment.

FIG. 3 is a schematic perspective view of the memory cell array of the embodiment. In FIG. 3, the insulating layer between the electrode layers, for instance, is not shown for clarity of illustration.

As shown in FIGS. 2 and 3, the memory cell array includes a substrate 10, a first stacked body 15, a plurality of columnar portions CL, a wiring layer LI, and an upper wiring. FIG. 3 shows a bit line BL and a source layer SL as the upper wiring.

The first stacked body 15 is provided on the substrate 10 via an insulating layer 41.

The first stacked body 15 includes a plurality of columnar portions CL extending in the Z-direction. The columnar portion CL is provided like e.g. a circular column or elliptical column. The plurality of columnar portions CL is provided in e.g. a zigzag pattern. Alternatively, the plurality of columnar portions CL may be provided in a square lattice along the X-direction and the Y-direction. The columnar portion CL is electrically connected to the substrate 10. The columnar portion CL is separated from the second stacked body 16 and the third stacked body 17. That is, the second stacked body 16 and the third stacked body 17 include no columnar portion.

The columnar portion CL includes a channel body 20, a memory film 30, and a core insulating film 50 shown in FIG. 2. The memory film 30 is provided between the first stacked body 15 and the channel body 20. The memory film 30 and the channel body 20 extend in the Z-direction.

The core insulating film 50 is provided inside the channel body 20. The channel body 20 may be shaped like e.g. a column. Alternatively, for instance, the core insulating film 50 may not be provided inside the channel body 20.

The channel body 20 is e.g. a silicon film composed primarily of silicon. The core insulating film 50 includes e.g. silicon oxide film, and may include an air gap.

The plurality of electrode layers WL of the first stacked body 15 includes a first electrode layer WLa and a second electrode layer WLb. The first electrode layer WLa is provided in the uppermost layer of the plurality of electrode layers WL. The second electrode layer WLb is provided in the lowermost layer of the plurality of electrode layers WL.

Here, the distance F1 between the first electrode layer WLa and the channel body 20 is equal to the distance F2 between the second electrode layer WLb and the channel body 20.

The first stacked body 15 includes a wiring layer LI extending in the X-direction and the Z-direction. The wiring layer LI is sandwiched by the first stacked body 15.

The wiring layer LI includes an insulating film 72 and a conductive film 71. The insulating film 72 is provided on the side surface of the wiring layer LI. The conductive film 71 is provided inside the insulating film 72.

The lower end of the wiring layer LI is electrically connected to the channel body 20 (semiconductor film) in the columnar portion CL through the substrate 10.

The wiring layer LI is electrically connected to the transistor of the peripheral circuit 4 through the source layer SL above the wiring layer LI.

A plurality of bit lines BL is provided on the first stacked body 15. The plurality of bit lines BL is separated from each other in the X-direction and extends in the Y-direction.

The upper end of the channel body 20 is electrically connected to the bit line BL through the contact part Cc. The lower end side of the channel body 20 is in contact with the substrate 10.

A plurality of channel bodies 20 each selected from one of the plurality of columnar portions CL separated in the Y-direction by the wiring layer LI is electrically connected to one common bit line BL.

A drain side select transistor STD is provided in the upper end part of the columnar portion CL. A source side select transistor STS is provided in the lower end part of the columnar portion CL.

The memory cell MC, the drain side select transistor STD, and the source side select transistor STS are vertical transistors in which a current flows in the stacking direction of the first stacked body 15.

The select gate SGD, SGS functions as a gate electrode of the corresponding select transistor STD, STS, i.e., a select gate. An insulating film functioning as a gate insulating film of the select transistor STD, STS is provided between the corresponding select gate SGD, SGS and the channel body 20.

A plurality of memory cells MC is provided between the drain side select transistor STD and the source side select transistor STS. Each electrode layer WL serves as a control gate of the corresponding memory cell MC. The plurality of memory cells MC is separately stacked each other.

The plurality of memory cells MC, the drain side select transistor STD, and the source side select transistor STS are series connected through the channel body 20 and constitute one memory string. Such memory strings are arranged in e.g. a zigzag pattern in a plane direction parallel to the X-Y plane. Thus, a plurality of memory cells MC is provided three-dimensionally in the X-direction, the Y-direction, and the Z-direction.

The semiconductor device of the embodiment can electrically and freely erase/write data and retain its memory content even when powered off.

An example of the memory cell MC of the embodiment is described with reference to FIG. 4.

Figure 4:
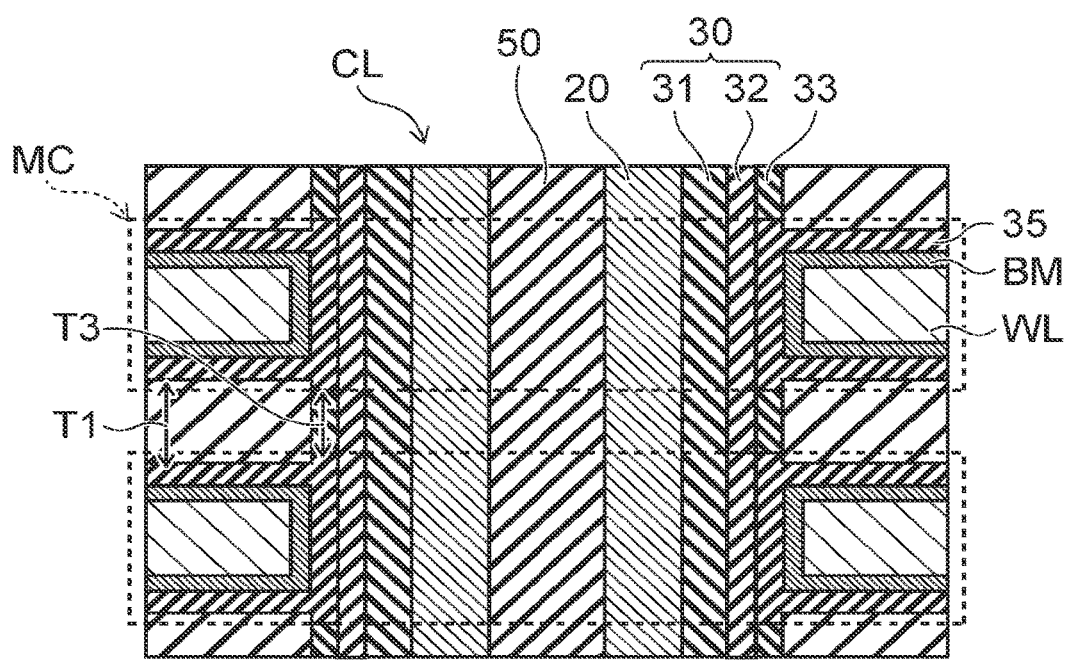
FIG. 4 is an enlarged schematic sectional view of part of the columnar portion of the embodiment.

FIG. 4 is an enlarged schematic sectional view of part of the columnar portion CL of the embodiment.

The memory cell MC is e.g. of the charge trap type. The memory cell MC includes an electrode layer WL, a memory film 30, a channel body 20, and a block insulating film 35.

The channel body 20 functions as a channel in the memory cell MC. The electrode layer WL functions as a control gate of the memory cell MC. The charge storage film 32 functions as a data storage layer for accumulating charge injected from the channel body 20. That is, the memory cell MC is formed in the crossing portion of the channel body 20 and each electrode layer WL. The memory cell MC has a structure in which the control gate surrounds the channel.

The memory film 30 includes e.g. a charge storage film 32 and a tunnel insulating film 31. The tunnel insulating film 31 is in contact with the channel body 20. The charge storage film 32 is provided between the electrode layer WL and the tunnel insulating film 31.

The charge storage film 32 includes a large number of trap sites for trapping charge. The charge storage film 32 includes at least one of e.g. silicon nitride film and hafnium oxide.

The tunnel insulating film 31 serves as a potential barrier when charge is injected from the channel body 20 into the charge storage film 32, or when the charge accumulated in the charge storage film 32 is diffused into the channel body 20. The tunnel insulating film 31 is e.g. a silicon oxide film.

Alternatively, the tunnel insulating film 31 may be a stacked film (ONO film) of the structure in which a silicon nitride film is sandwiched by a pair of silicon oxide films. The tunnel insulating film 31 made of ONO film enables erase operation at lower electric field than a monolayer of silicon oxide film.

The block insulating film 35 is provided between the electrode layer WL and the charge storage film 32. The block insulating film 35 covers the wall surface of the electrode layer WL via the barrier film BM. The block insulating film 35 is in contact with the charge storage film 32. The block insulating film 35 may be provided in e.g. the columnar portion CL.

The block insulating film 35 prevents the charge accumulated in the charge storage film 32 from diffusing into the electrode layer WL. The block insulating film 35 includes at least one of e.g. hafnium, aluminum, zirconium, and lanthanum. The block insulating film 35 is made of a material having higher permittivity (high dielectric oxide film, high-k film) than silicon nitride film.

The block insulating film 35 includes e.g. a cap film and a block film. The block film is placed between the cap film and the charge storage film 32. The block film is e.g. a silicon oxide film.

The cap film is provided in contact with the electrode layer WL. The cap film is a film having higher permittivity than the block film. The cap film includes at least one of e.g. hafnium, aluminum, zirconium, and lanthanum described above. The cap film is made of at least one of e.g. silicon nitride film and aluminum oxide.

Providing the cap film in contact with the electrode layer WL can suppress back tunneling electrons injected from the electrode layer WL at erase time. That is, the block insulating film 35 is a stacked film of silicon oxide film and one of silicon nitride film and high dielectric oxide film. This can enhance the charge blocking capability.

A cover film 33 is provided between the insulating layer 40 and the charge storage film 32. The cover film 33 is in contact with the charge storage film 32 and the side surface of the insulating layer 40. The cover film 33 is intermittently provided via the block insulating film 35 in e.g. the Z-direction. That is, the cover film 33 is provided on the upper surface and the lower surface of the block insulating film 35, and separated from the side surface of the block insulating film 35. In the Z-direction, the thickness T1 of the insulating layer 40 is thicker than e.g. the thickness T3 of the cover film 33. The cover film 33 is e.g. a silicon oxide film. The cover film 33 may be in contact with the side surface of the block insulating film 35, and provided integrally in the Z-direction.

A method for manufacturing a semiconductor device of this embodiment is described with reference to FIGS. 5 to 11.

With regard to the aforementioned configuration, the description of similar contents is partially omitted. In FIGS. 7 to 9 and FIG. 11, the description of the configuration of the scribe line 3 is omitted, because it can be easily assumed from the configuration of the staircase section 2.

Figure 5:
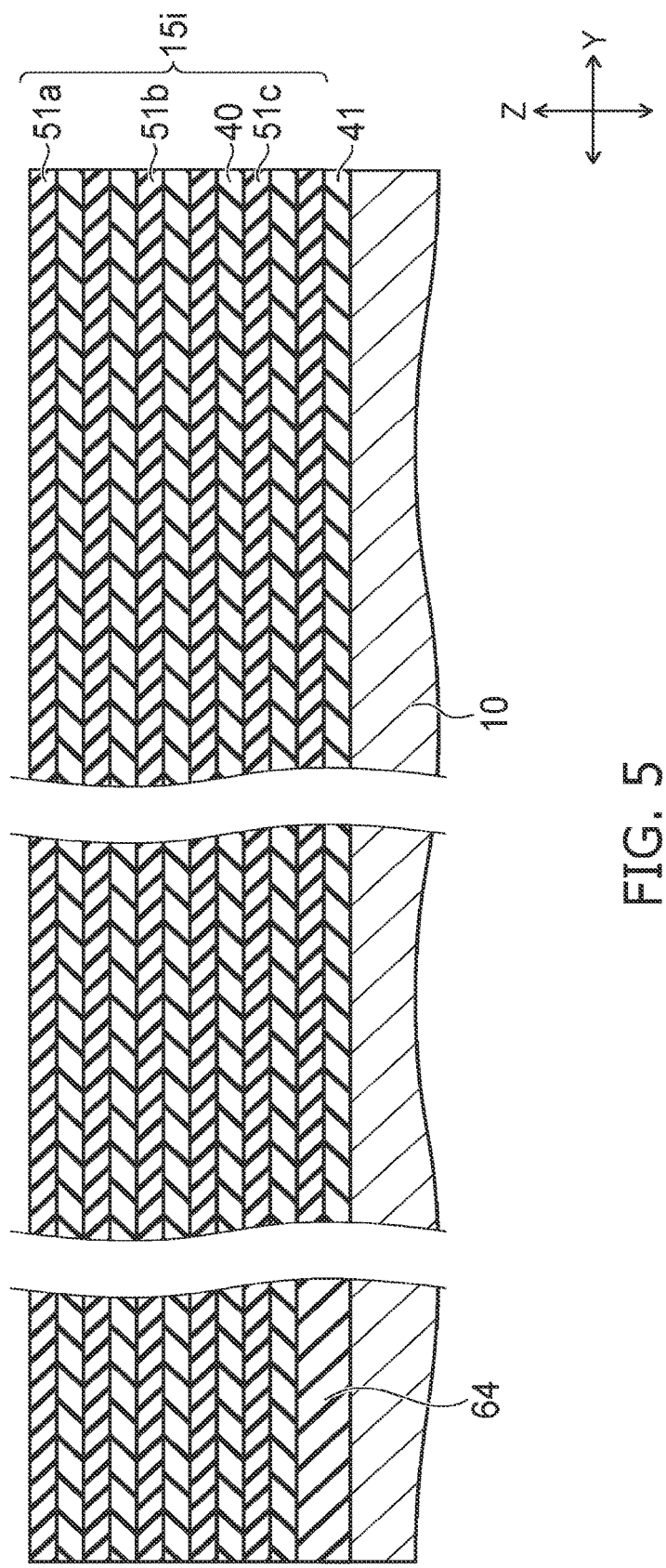
FIG. 5 to FIG. 11 are schematic sectional views showing a method for manufacturing the semiconductor memory device of the first embodiment.

As shown in FIG. 5, insulating layers 41, 64 are formed on a substrate 10. The upper surface of the insulating layer 64 is higher than e.g. the upper surface of the insulating layer 41. A stacked body 15i is formed on the insulating layer 41 and on the insulating layer 64.

The number of stacked layers of the stacked body 15i on the insulating layer 64 is less than or equal to the number of stacked layers of the stacked body 15i on the insulating layer 41. The upper surface of the stacked body 15i on the insulating layer 64 is coplanar with the upper surface of the stacked body 15i on the insulating layer 41.

The stacked body 15i includes a plurality of sacrificial layers 51 (a plurality of first layers) and a plurality of first insulating layers 40 (a plurality of second layers). The plurality of sacrificial layers 51 is separately stacked each other. The plurality of insulating layers 40 is stacked alternately with the plurality of sacrificial layers 51.

The plurality of sacrificial layers 51 includes e.g. a first sacrificial layer 51a, a second sacrificial layer 51b, and a third sacrificial layer 51c. The second sacrificial layer 51b is formed between the substrate 10 and the first sacrificial layer 51a. The third sacrificial layer 51c is formed between the substrate 10 and the second sacrificial layer 51b. The film density of the second sacrificial layer 51b is higher than the film density of the third sacrificial layer 51c and lower than the film density of the first sacrificial layer 51a. That is, the plurality of sacrificial layers 51 has higher film density in the uppermost layer than in the lowermost layer.

The stacked body 15i is formed by e.g. PECVD (plasma-enhanced chemical vapor deposition) technique. In this case, the film density in each of the plurality of sacrificial layers 51 is changed by e.g. adjusting the film formation parameter for forming the plurality of sacrificial layers 51. Alternatively, the stacked body 15i may be formed by e.g. ALD (atomic layer deposition) technique. The details of the method for changing the film density of the plurality of sacrificial layers 51 will be described later.

The plurality of sacrificial layers 51 includes e.g. silicon nitride film. The plurality of first insulating layers 40 includes e.g. silicon oxide film.

Figure 6:
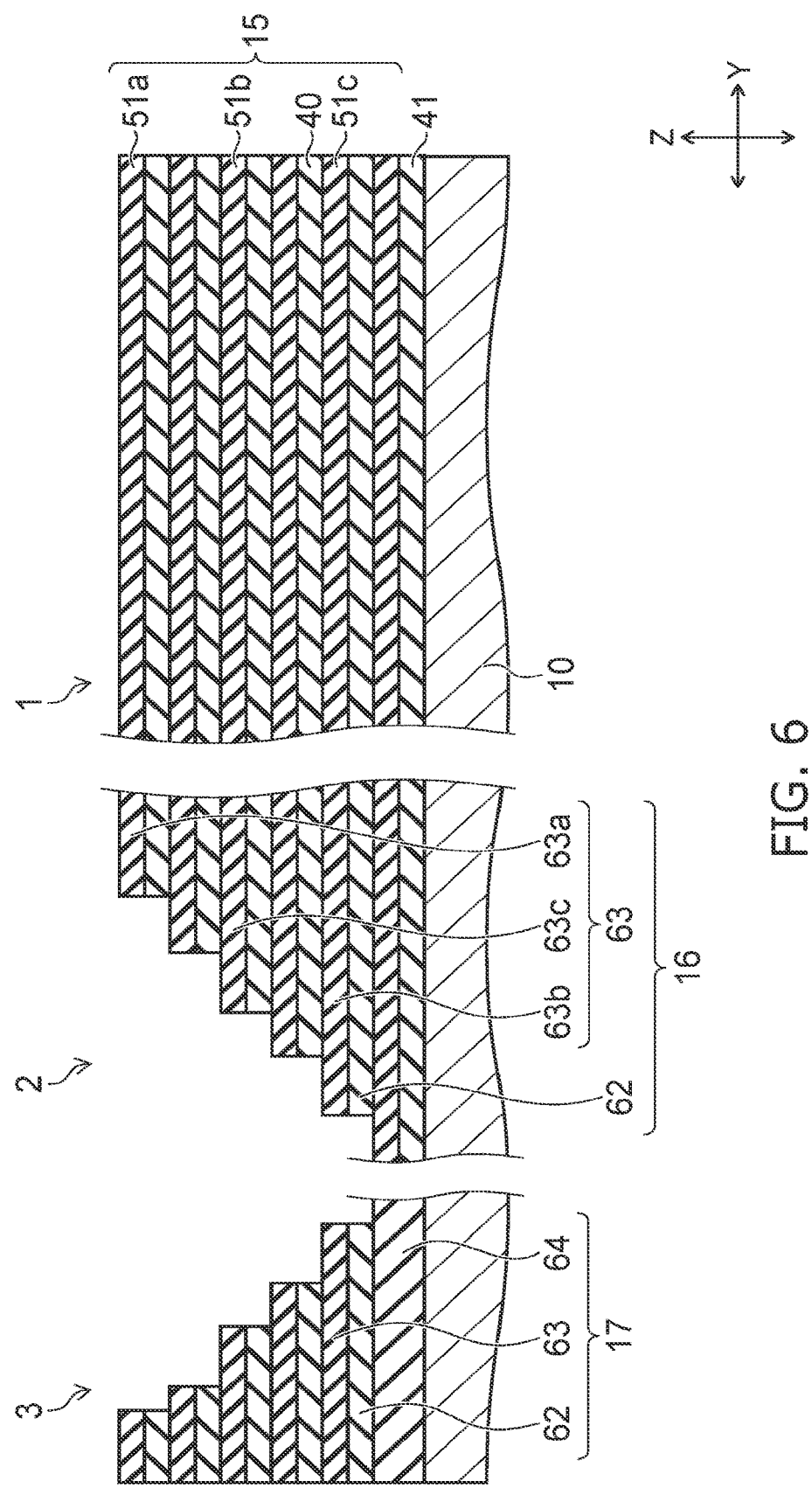

As shown in FIG. 6, a staircase shape is formed in the stacked body 15i. Thus, a first stacked body 15, a second stacked body 16, and a third stacked body 17 are formed. The first stacked body 15 is formed in the memory cell section 1. The second stacked body 16 is formed in the staircase section 2. The third stacked body 17 is formed in the scribe line 3.

The second stacked body 16 includes a plurality of second insulating layers 62 and a plurality of third insulating layers 63. The second stacked body 16 is formed integrally with the first stacked body 15. That is, the plurality of second insulating layers 62 is formed integrally with the plurality of first insulating layers 40. The plurality of third insulating layers 63 is formed integrally with the plurality of sacrificial layers 51. The number of stacked layers of the second stacked body 16 is equal to the number of stacked layers of the first stacked body 15.

Like the second stacked body 16, the third stacked body 17 includes a plurality of second insulating layers 62 and a plurality of third insulating layers 63. The third stacked body 17 is separated from the second stacked body 16 across the staircase shape. The number of stacked layers of the third stacked body 17 is smaller than the number of stacked layers of the first stacked body 15 and the number of stacked layers of the second stacked body 16.

Like the plurality of sacrificial layers 51, the plurality of third insulating layers 63 of the second stacked body 16 and the third stacked body 17 have higher film density in the uppermost layer than in the lowermost layer. The plurality of sacrificial layers 51 and the plurality of third insulating layers 63 include e.g. silicon nitride film. The plurality of first insulating layers 40 and the plurality of second insulating layers 62 include e.g. silicon oxide film.

Figure 7:
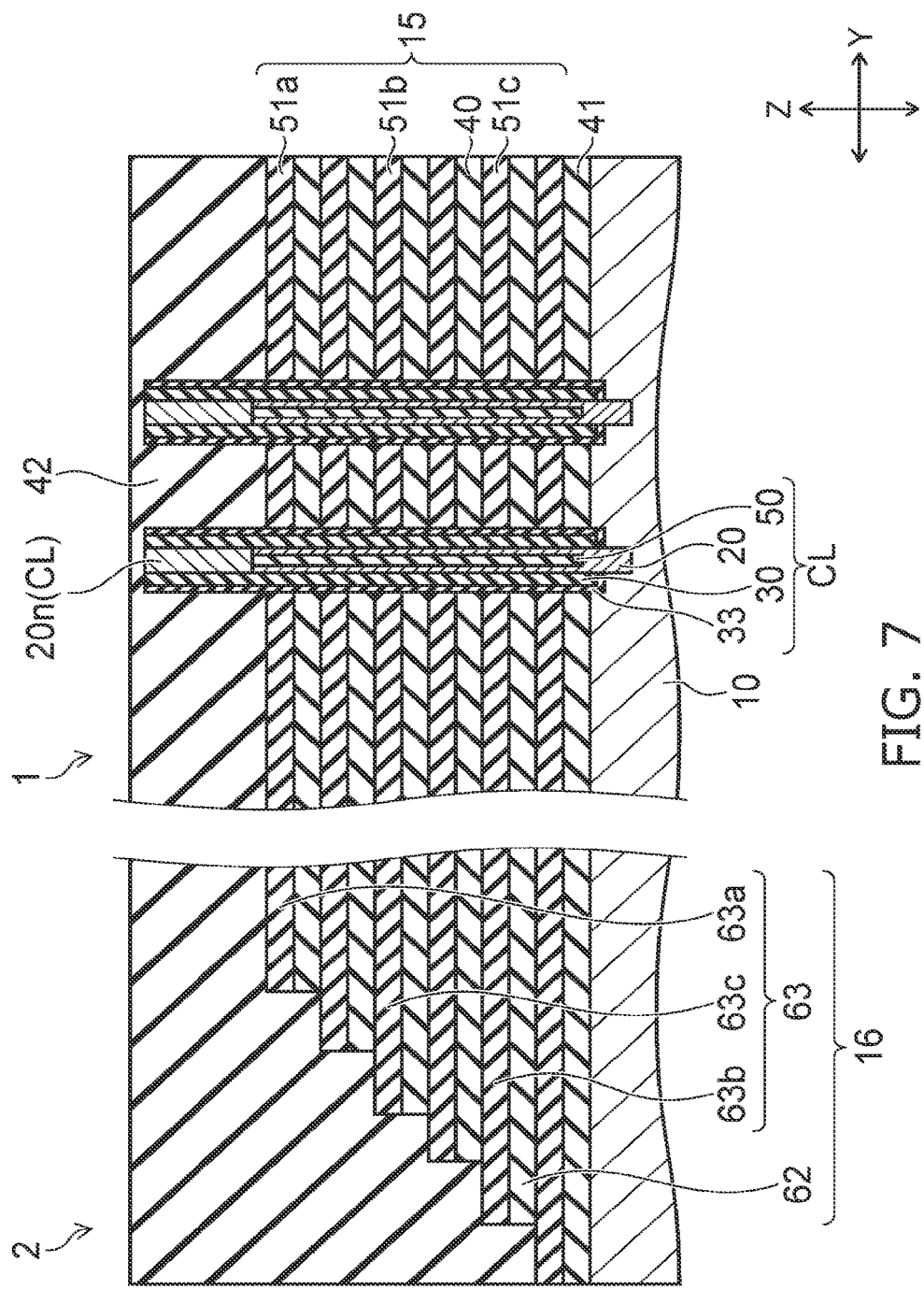

As shown in FIG. 7, a columnar portion CL is formed in the first stacked body 15. The columnar portion CL is formed by e.g. the following method. A hole piercing the first stacked body 15 to reach the substrate 10 is formed. Then, the cover film 33, the memory film 30, the channel body 20, and the core insulating film 50 shown in FIG. 4 are sequentially formed in the hole. Thus, the columnar portion CL is formed. At this time, the channel body 20 is electrically connected to the substrate 10.

The cover film 33 includes e.g. silicon oxide film. The channel body 20 includes e.g. amorphous silicon. The core insulating film 50 includes e.g. silicon oxide film. The charge storage film 32 of the memory film 30 includes e.g. silicon nitride film. The tunnel insulating film 31 includes e.g. silicon oxide film.

Then, an insulating layer 42 is formed on the stacked bodies 15-17.

Figure 8:
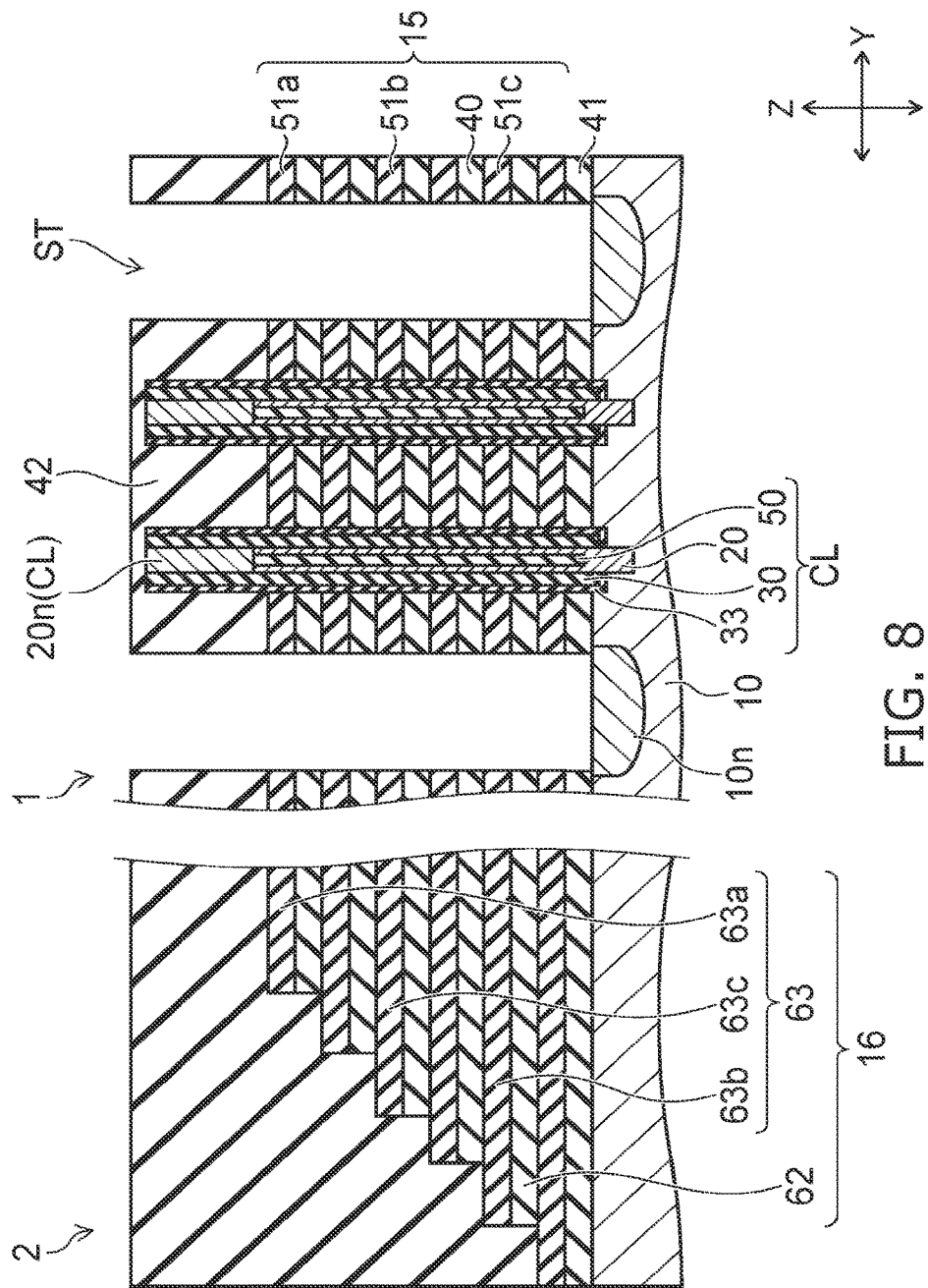

As shown in FIG. 8, a slit ST is formed in the insulating layer 42 and in the first stacked body 15. The slit ST pierces the insulating layer 42 and the first stacked body 15 to reach the substrate 10. The slit ST extends in the X-direction. Then, the portion of the substrate 10 exposed to the slit ST is doped with e.g. n-type impurity (e.g., phosphorus). Thus, a semiconductor part 10n is formed. Alternatively, the substrate 10 may be doped with e.g. p-type impurity (e.g., boron).

Figure 9:
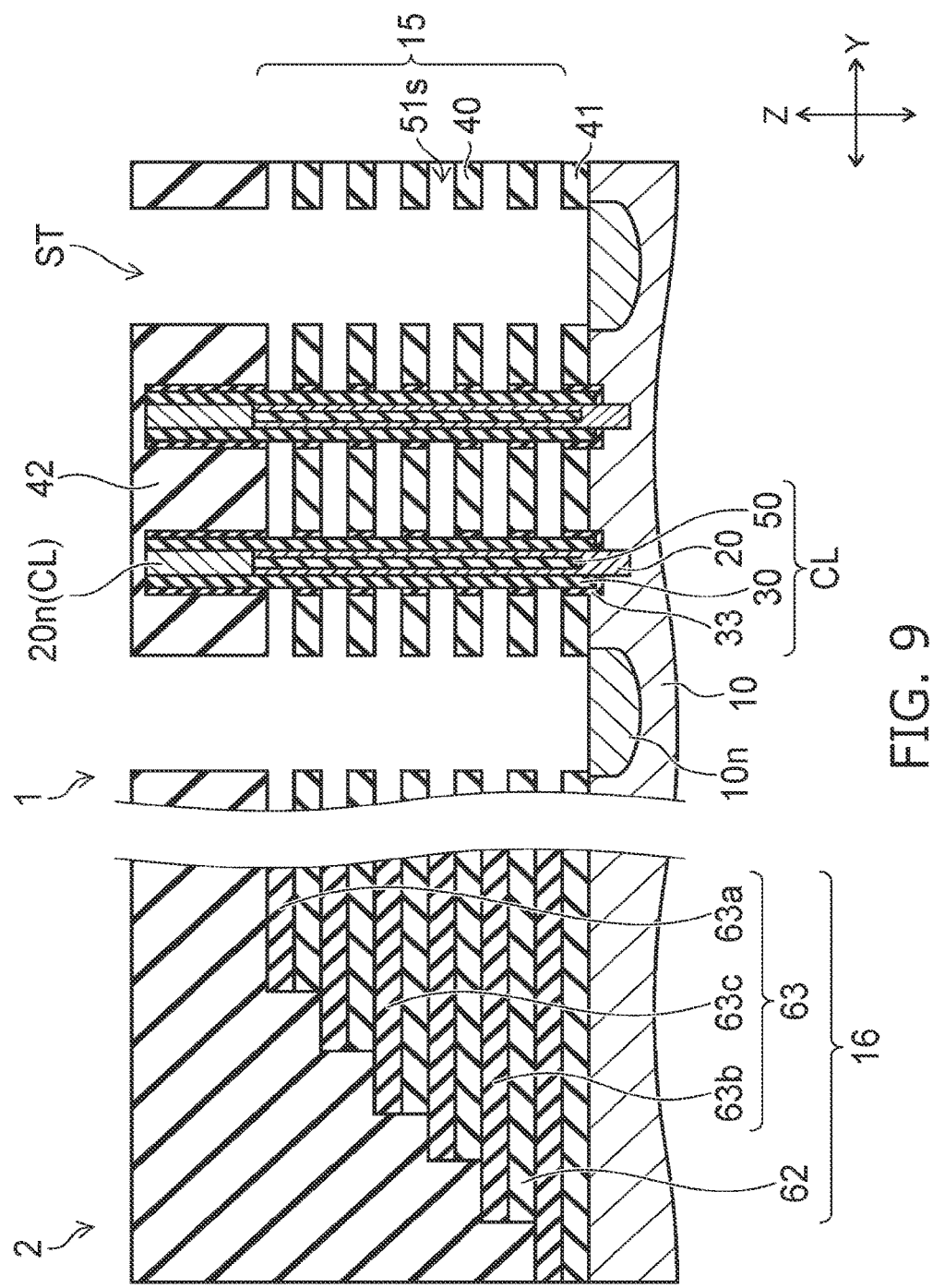

As shown in FIG. 9, the plurality of sacrificial layers 51 is removed by e.g. etching technique through the slit ST. Thus, a space 51s is formed in the portion in which the plurality of sacrificial layers 51 was formed. The etching technique uses e.g. phosphoric acid (hot $H_3PO_4$).

At this time, the plurality of sacrificial layers 51 of the first stacked body 15 is removed uniformly from the upper layer to the lower layer. Thus, after forming the electrode layers WL described later, as shown in FIG. 2, the distance F1 between the first electrode layer WLa and the channel body 20 is equal to the distance F2 between the second electrode layer WLb and the channel body 20. Here, the plurality of third insulating layers 63 of the second stacked body 16 is not removed.

Figure 10:
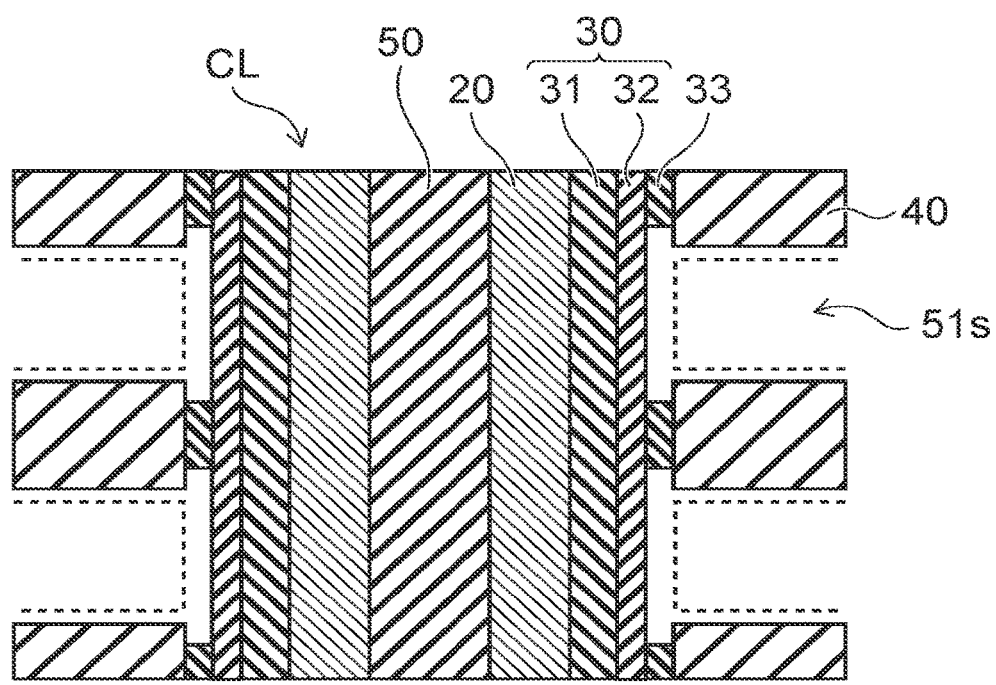

As shown in FIG. 10, part of the plurality of first insulating layers 40 and part of the cover film 33 are removed (dotted line part of FIG. 10). Thus, as shown in FIG. 2, the thickness T2 of the plurality of second insulating layers 62 is thicker than the thickness T1 of the plurality of first insulating layers 40. Alternatively, part of the plurality of first insulating layers 40 and the cover film 33 may not be removed. In this case, the process is advanced in the state in which the cover film 33 is formed integrally in the Z-direction.

Figure 11:
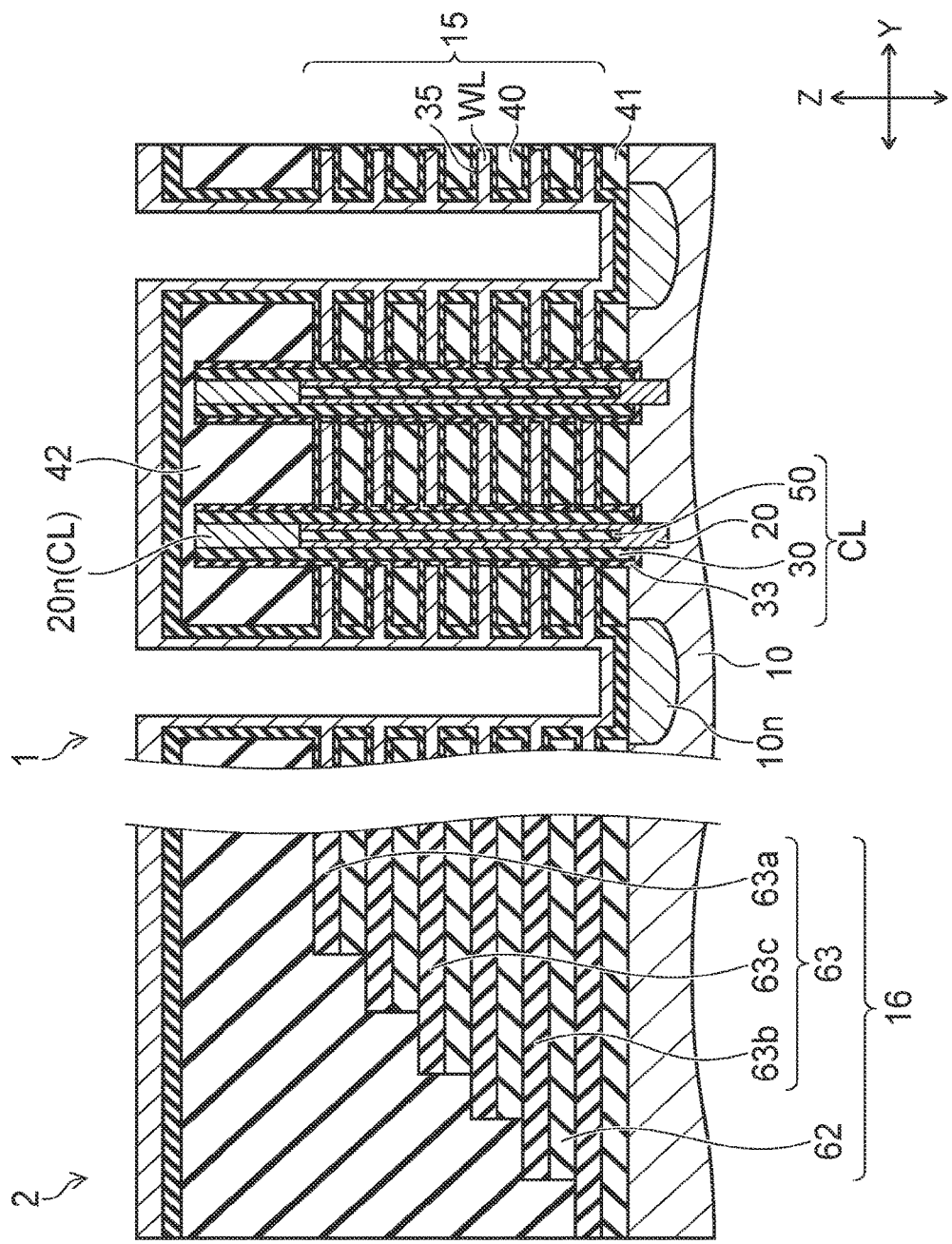

As shown in FIG. 11, a block insulating film 35 is formed on the inner wall of the space 51s. The barrier film BM shown in FIG. 4 is formed inside the block insulating film 35. An electrode layer WL, a source side select gate SGS, and a drain side select gate SGD are formed inside the barrier film BM.

The block insulating film 35 includes e.g. a stacked film of silicon oxide film and aluminum oxide. The barrier film BM includes e.g. a stacked film of titanium nitride and titanium. The electrode layer WL, the source side select gate SGS, and the drain side select gate SGD include e.g. tungsten.

Then, the films 35, BM, WL formed in the slit ST and on the insulating layer 42 are removed. Next, as shown in FIG. 2, an insulating film 72 is formed on the side surface of the slit ST. A conductive film 71 is formed inside the insulating film 72. Thus, a wiring layer LI is formed. Contact parts CI, Cc are formed on the wiring layer LI and on the columnar portion CL, respectively. The upper wiring and the like shown in FIG. 3 are formed. Thus, the semiconductor device of this embodiment is formed.

An example of the relationship between film density and etching rate is described with reference to FIG. 12A.

Figure 12A:
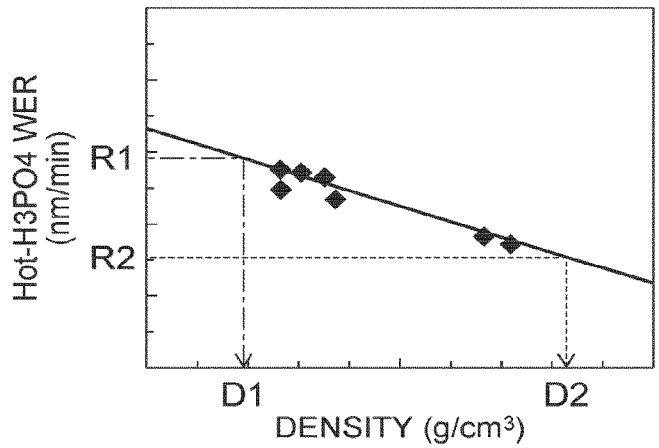
FIG. 12A is a graph showing the relationship between film density and etching rate.

FIG. 12A is a graph showing the relationship between film density and etching rate. The solid line in the figure represents a linear approximation in the relationship of etching rate to film density. The solid line indicates a linear approximation for the plotted measurement results.

As indicated by the solid line, etching rate tends to decrease with the increase of film density. For instance, the first film density D1 is lower than the second film density D2. Here, the first etching rate R1 corresponding to the first film density D1 is higher than the second etching rate R2 corresponding to the second film density D2. That is, the film density can be confirmed by etching the insulating film.

An example of the relationship between film formation parameters at the time of film formation and film density is described with reference to FIGS. 12B to 14B.

Figure 12B:
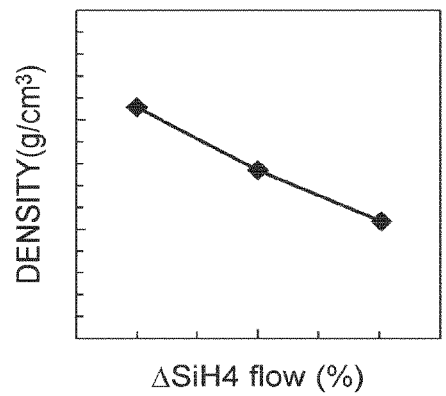
FIGS. 12B to 12D are graphs showing the relationship between film formation parameters at the time of film formation and film density.
Figure 12C:
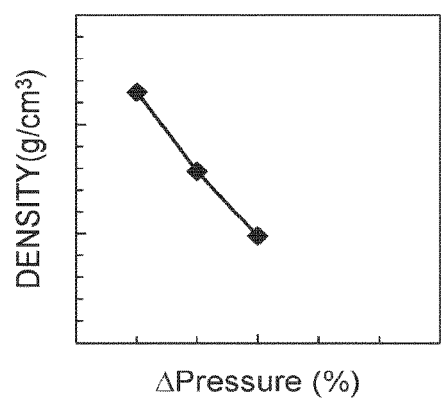
Figure 12D:
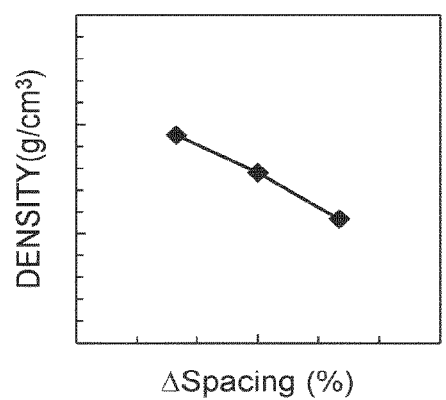
Figure 13A:
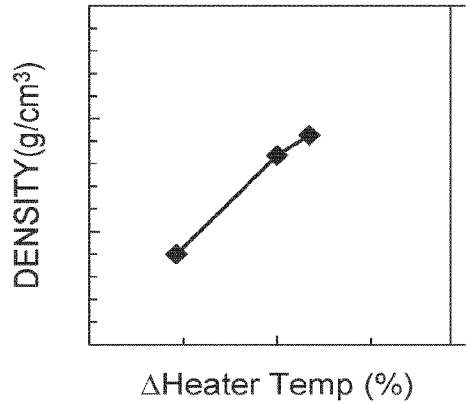
FIGS. 13A to 13D are graphs showing the relationship between film formation parameters at the time of film formation and film density.
Figure 13B:
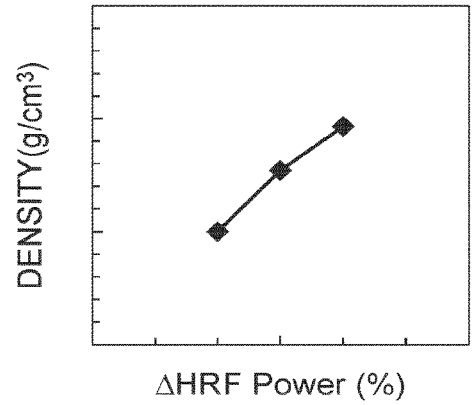
Figure 13C:
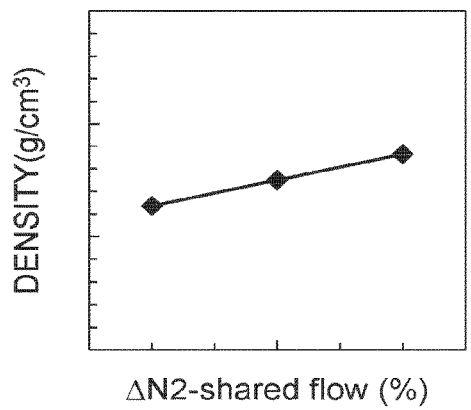
Figure 13D:
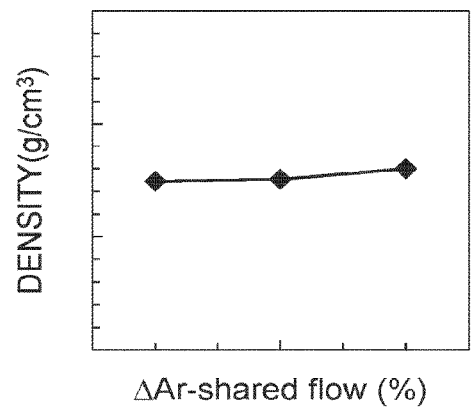
Figure 14A:
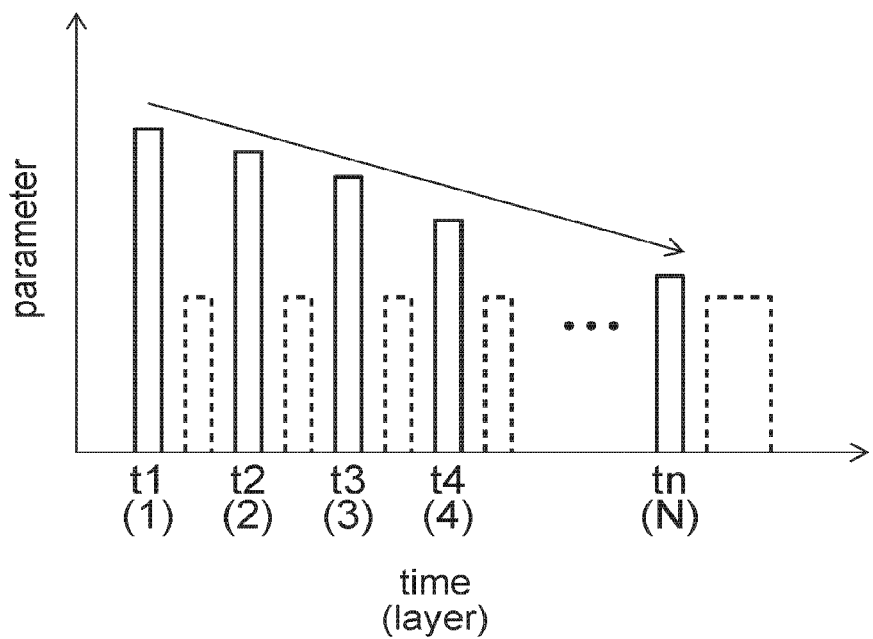
FIG. 14A and FIG. 14B are graphs showing the relationship between film formation time and the film formation parameter.
Figure 14B:
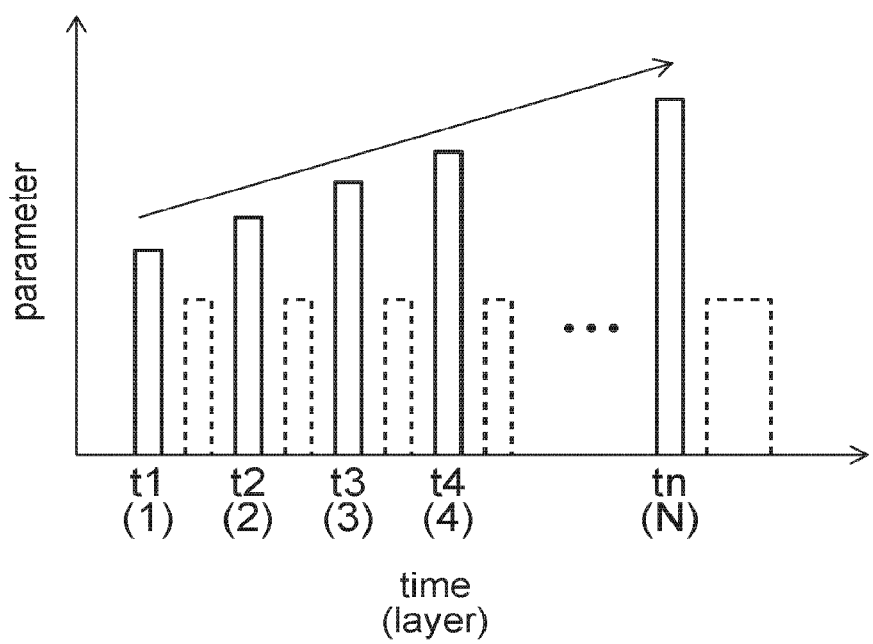

FIG. 12B is a graph showing the relationship between silane flow rate and film density. FIG. 12C is a graph showing the relationship between chamber pressure and film density. FIG. 12D is a graph showing the relationship between interelectrode spacing and film density. FIG. 13A is a graph showing the relationship between heater temperature and film density. FIG. 13B is a graph showing the relationship between RF power and film density. FIG. 13C is a graph showing the relationship between nitrogen flow rate and film density. FIG. 13D is a graph showing the relationship between argon flow rate and film density. FIGS. 14A and 14B are graphs showing the relationship between film formation time and the film formation parameter. In FIGS. 14A and 14B, the sacrificial layer 51 is formed in the range indicated by the solid line. The first insulating layer 40 is formed in the range indicated by the dotted line.

As shown in FIGS. 12B to 12D, film density tends to decrease with the increase of one of silane flow rate, chamber pressure, and interelectrode spacing.

For instance, when the sacrificial layer 51 is formed by e.g. CVD technique, the value of one of silane flow rate, chamber pressure, and interelectrode spacing is decreased with the increase of the number of layers. In this case, as shown in e.g. FIG. 14A, the value of the film formation parameter of the sacrificial layer 51 is decreased with the passage of time. This enables formation of a stacked body including the sacrificial layers 51 having higher film density in the upper layer than in the lower layer. In addition to the foregoing, the ratio of silane flow rate (precursor) to ammonia flow rate also exhibits a similar tendency.

As shown in FIGS. 13A to 13D, film density tends to increase with the increase of one of heater temperature, RF power, nitrogen flow rate, and argon flow rate.

For instance, when the sacrificial layer 51 is formed by e.g. CVD technique, the value of one of heater temperature, RF power, nitrogen flow rate, and argon flow rate is increased with the increase of the number of layers. In this case, as shown in e.g. FIG. 14B, the value of the film formation parameter of the sacrificial layer 51 is increased with the passage of time. This enables formation of a stacked body including the sacrificial layers 51 having higher film density in the upper layer than in the lower layer. In addition to the foregoing, the ratio of nitrogen flow rate to precursor flow rate and the ratio of argon flow rate to precursor flow rate also exhibit a similar tendency. Here, the aforementioned "value" refers to the value on the horizontal axis of the graph.

The effect of the embodiment is now described.

According to the embodiment, the second stacked body 16 includes a plurality of third insulating layers 63. The third insulating layers 63 include a first insulating film 63a and a second insulating film 63b. The second insulating film 63b is provided between the first insulating film 63a and the substrate 10. The film density of the second insulating film 63b is lower than the film density of the first insulating film 63a. For instance, the plurality of third insulating layers 63 has higher film density with the distance in the Z-direction from the substrate 10. This can suppress the degradation of characteristics in the device.

For instance, there may be a case where a plurality of insulating layers provided in the second stacked body has an equal film density. In this case, a plurality of sacrificial layers used to form a plurality of electrode layers has an equal film density. Then, if the plurality of sacrificial layers is removed by etching technique, the upper sacrificial layer is removed in a larger amount than the lower sacrificial layer. This expands the removed range of the upper layer. Thus, part of the charge accumulation layer and the like may also be removed. This may degrade the characteristics of the device.

In contrast, this embodiment forms sacrificial layers 51 having higher film density with the increase of the number of layers. The etching rate of the sacrificial layer 51 having high film density is lower than the etching rate of the sacrificial layer 51 having low film density. That is, the etching rate of the sacrificial layer 51 decreases with the distance from the substrate 10 in the stacking direction of the first stacked body 15. Thus, when the film density of the sacrificial layers 51 is controlled, the sacrificial layers 51 of the first stacked body 15 can be removed uniformly from the upper layer to the lower layer. This can suppress the degradation of characteristics of the device.

In addition to the foregoing, according to this embodiment, the second stacked body 16 includes a plurality of second insulating layers 62 and a plurality of third insulating layers 63. This can maintain insulation between the memory cell section 1 and the peripheral circuit, and suppress the degradation of characteristics of the device.

Furthermore, the film density of the first insulating layer 40 and the second insulating layer 62 may be controlled as in e.g. the third insulating layer 63. Then, the plurality of first insulating layers 40 can be set back uniformly from the upper layer to the lower layer when part of the cover film 33 is removed. This can further suppress the degradation of characteristics of the device.

In the aforementioned embodiment, the columnar portion CL is configured to be electrically connected to the wiring layer LI through the substrate 10. Alternatively, the columnar portion CL may be configured to be electrically connected to the wiring layer LI without the intermediary of the substrate 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
    a substrate;
    a first stacked body provided on the substrate and including:
        a plurality of first insulating layers separately stacked each other; and
        a plurality of electrode layers provided between the plurality of first insulating layers;
    a semiconductor film provided in the first stacked body and extending in stacking direction of the first stacked body;
    a charge storage film provided between the plurality of electrode layers and the semiconductor film; and
    a second stacked body provided on the substrate and including:
        a plurality of second insulating layers separately stacked each other and including a same material as the plurality of first insulating layers;
        a first insulating film provided between the plurality of second insulating layers, the first insulating film including a material different from that of the plurality of first insulating layers, the plurality of second insulating layers, and the plurality of electrode layers; and
        a second insulating film provided between the first insulating film and the substrate via the plurality of second insulating layers, the second insulating film including a same material as the first insulating film, the second insulating film having lower film density than the first insulating film.

2. The device according to claim 1, wherein number of stacked layers of the plurality of second insulating layers is less than or equal to number of stacked layers of the plurality of first insulating layers.

3. The device according to claim 1, wherein the first insulating film and the second insulating film include silicon nitride film.

4. The device according to claim 1, wherein
    the second stacked body further includes a third insulating film provided between the first insulating film and the second insulating film via the plurality of second insulating layers, the third insulating film including the same material as the first insulating film and the second insulating film, and
    a film density of the third insulating film is lower than the film density of the first insulating film and higher than the film density of the second insulating film.

5. The device according to claim 1, wherein the plurality of first insulating layers and the plurality of second insulating layers include silicon oxide film.

6. The device according to claim 1, wherein thickness of the plurality of second insulating layers is thicker than thickness of the plurality of first insulating layers.

7. The device according to claim 1, wherein the second stacked body has a staircase shape.

8. The device according to claim 1, wherein the second stacked body is separated from the semiconductor film and the charge storage film.

9. The device according to claim 1, wherein
    the plurality of electrode layers includes:
        a first electrode layer provided in an uppermost layer of the plurality of electrode layers; and
        a second electrode layer provided in a lowermost layer of the plurality of electrode layers, and
    a distance between the first electrode layer and the semiconductor film is equal to a distance between the second electrode layer and the semiconductor film.

10. A semiconductor device comprising:
    a substrate;
    a first stacked body provided on the substrate and including:
        a plurality of first insulating layers separately stacked each other; and
        a plurality of electrode layers provided between the plurality of first insulating layers;
    a semiconductor film provided in the first stacked body and extending in stacking direction of the first stacked body;
    a charge storage film provided between the plurality of electrode layers and the semiconductor film; and
    a second stacked body provided on the substrate and including:
        a plurality of second insulating layers separately stacked each other and including a same material as the plurality of first insulating layers; and
        a plurality of third insulating layers provided between the plurality of second insulating layers, the plurality of third insulating layers including a material different from that of the plurality of first insulating layers and the plurality of second insulating layers, the plurality of third insulating layers having higher film density with distance in the stacking direction from the substrate.

11. The device according to claim 10, wherein number of stacked layers of the plurality of second insulating layers is less than or equal to number of stacked layers of the plurality of first insulating layers.

12. The device according to claim 10, wherein the plurality of third insulating layers includes silicon nitride film.

13. The device according to claim 12, wherein the plurality of first insulating layers and the plurality of second insulating layers include silicon oxide film.

14. The device according to claim 10, wherein thickness of the plurality of second insulating layers is thicker than thickness of the plurality of first insulating layers.

15. The device according to claim 10, wherein the second stacked body has a staircase shape.

* * * * *